United States Patent
Kushibe et al.

(10) Patent No.: US 7,276,735 B2
(45) Date of Patent: *Oct. 2, 2007

(54) LAMINATED SEMICONDUCTOR SUBSTRATE AND OPTICAL SEMICONDUCTOR ELEMENT

(75) Inventors: Mitsuhiro Kushibe, Tokyo (JP); Yasuo Ohba, Kanagawa-Ken (JP); Rei Hashimoto, Tokyo (JP); Keiji Takaoka, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 87 days.

This patent is subject to a terminal disclaimer.

(21) Appl. No.: 10/884,141

(22) Filed: Jul. 2, 2004

(65) Prior Publication Data

US 2004/0245536 A1 Dec. 9, 2004

Related U.S. Application Data

(63) Continuation of application No. 10/400,633, filed on Mar. 28, 2003, now Pat. No. 6,768,137.

(30) Foreign Application Priority Data

Mar. 29, 2002 (JP) ............................. 2002-094598
Mar. 20, 2003 (JP) ............................. 2003-078955

(51) Int. Cl.
*H01L 29/201* (2006.01)
(52) U.S. Cl. .................. 257/94; 257/96; 257/103; 257/E22.027; 257/E33.032
(58) Field of Classification Search ........ 257/E33.028, 257/103, 94, 190, 201, 96, 97, E33.026, E33.027, 257/E33.031, E33.032, 183
See application file for complete search history.

(56) References Cited

U.S. PATENT DOCUMENTS

| 5,710,439 | A | 1/1998 | Ohkubo |
| 5,825,796 | A | 10/1998 | Jewell et al. |
| 6,100,546 | A | 8/2000 | Major et al. |
| 6,303,473 | B1 | 10/2001 | Heffernan et al. |
| 6,750,480 | B2 * | 6/2004 | Welser et al. ............... 257/183 |
| 6,829,271 | B2 * | 12/2004 | Sato et al. ............... 372/44.01 |
| 2002/0034203 | A1 * | 3/2002 | Shimizu et al. ............... 372/45 |

FOREIGN PATENT DOCUMENTS

| JP | 7-66366 | 3/1995 |
| JP | 7-94524 | 4/1995 |
| JP | 09213918 A | 8/1997 |
| JP | 2000-150388 | 5/2000 |
| JP | 2000-196148 | 7/2000 |

* cited by examiner

Primary Examiner—Matthew C. Landau
(74) Attorney, Agent, or Firm—Oblon, Spivak, McClelland, Maier & Neustadt, P.C.

(57) ABSTRACT

A low-cost high-property optical semiconductor element for a long wavelength is provided, using a GaAs substrate. The optical semiconductor element comprises a substrate of GaAs having a first surface and a second surface opposite to each other, a buffer layer of $In_jGa_{1-j}As_{1-k}N_k$ ($0 \leq j \leq 1$, $0.002 \leq k \leq 0.05$) formed on the first surface of the substrate, a first conductive type clad layer formed on the buffer layer, an active layer formed on the first conductive type clad layer and comprising a well layer of $In_zGa_{1-z}As$ ($0 \leq z \leq 1$), the well layer having a smaller bandgap than the first conductive type clad layer, the active layer having a thickness of more than its critical thickness for the substrate based upon equilibrium theories, and a second conductive type clad layer formed on the active layer and having a larger bandgap than the well layer.

15 Claims, 6 Drawing Sheets

LAMINATED SEMICONDUCTOR SUBSTRATE AND OPTICAL SEMICONDUCTOR ELEMENT

CROSS-REFERENCE TO RELATED APPLICATIONS

This application is based upon and claims the benefits of priority under 35 USC § 120 form U.S. application Ser. No. 10/400,633, filed Mar. 28, 2003, now U.S. Pat. No. 6,768,137, and under 35 USC § 119 form the prior Japanese Patent Application No. 2002-094598, filed on Mar. 29, 2002, No. 2003-078955, filed on Mar. 20, 2003, the entire contents of which are incorporated herein by reference.

BACKGROUND OF THE INVENTION

1. Field of the Invention

The present invention relates to a laminated semiconductor substrate and an optical semiconductor element.

2. Related Background Art

A long wavelength (from 1.25 μm to 1.6 μm) optical semiconductor element, especially 1.3 μm wavelength band (from 1.25 μm to 1.35 μm) optical semiconductor element attracts attention as a light emitting element or a photodetector element for optical communication. In the prior art, the semiconductor light emitting element of this long wavelength has a structure in which an active layer (light emitting layer) of an InGaAsP compound semiconductor is formed on an InP substrate (supporting substrate). In this structure, lattice mismatch between the active layer and the substrate is small, and the element is easy to manufacture.

The semiconductor light emitting element using the InP substrate is, however, expensive because the InP substrate is expensive. The element using the InP substrate has a bad temperature characteristic. Therefore, the problem with the semiconductor light emitting element using the InP substrate is that it is expensive and has a bad temperature characteristic. In order to provide inexpensive optical semiconductor elements excellent in temperature characteristic, the development of elements that comprise a GaAs substrate and an active layer of an InGaAs compound semiconductor has been promoted. The GaAs substrate is generally used in an optical semiconductor element for a wavelength of 0.98 μm, and has the advantages of being inexpensive and easy to work. In order to provide inexpensive optical semiconductor elements for a long wavelength, using those advantages, the development of elements using GaAs substrates has been promoted.

However, the problem with the semiconductor light emitting element using the GaAs substrate for a long wavelength also is that its light emission intensity is low. This is because the lattice constant of the InGaAs active layer is large compared to the GaAs substrate and the lattice mismatch between them is large. Therefore, cracks are liable to occur in the active layer.

In somewhat more detail, as the In composition of InGaAs increases, the bandgap wavelength increases. Therefore, in order to provide an optical semiconductor element using an InGaAs active layer for a long wavelength, the In composition of the active layer should increase. In addition, in order to provide an optical semiconductor element for a long wavelength, the thickness of the active layer should be large because if the thickness of the active layer decreases, the wavelength of the element would be short due to a quantum effect. Therefore, in order to provide an optical semiconductor element for a long wavelength, using the InGaAs active layer, an active layer having a high In composition and a large thickness should be formed. However, when the In composition of the active layer increases, the lattice mismatch between the InGaAs active layer and the GaAs substrate would increase. This causes to decrease the critical thickness of the active layer for the substrate based upon equilibrium theories. If the active layer has a larger thickness than the critical thickness, a large number of cracks would usually occur in the active layer. As a result, in the conventional optical semiconductor element using the GaAs substrate for a long wavelength, a large number of cracks would occur in the active layer to thereby extremely decrease the light emission intensity.

In order to prevent cracks from occurring in the active layer, a method of mixing nitrogen (N) into the active layer to thereby decrease the lattice constant of the active layer was used. This method increases the critical thickness of the active layer for the substrate based upon equilibrium theories. In this method, however, the concentration of nitrogen in the active layer increases to thereby decrease the light emission intensity. Consequently, this method cannot provide a sufficiently high light emission intensity. As another method of preventing the occurrence of cracks in the active layer, it has been tried to provide a buffer layer between the substrate and the active layer. This method intends to prevent the number of cracks from increasing in the active layer even when the active layer has a larger thickness than its critical thickness for the substrate based upon the equilibrium theories. In this method, a certain effect is produced when the active layer and the substrate are composed of materials the lattice mismatch between which is small. However, in the conventional buffer layer, the number of cracks occurring in the active layer cannot be sufficiently reduced when there is a large lattice mismatch between the substrate and the active layer. Thus, even by using such buffer layer, the light emission intensity cannot sufficiently increase.

As described above, the problem with the conventional semiconductor light emission element using the GaAs substrate for a long wavelength is that the light emission intensity is low.

As with the optical semiconductor element using the GaAs substrate for a long wavelength, the problem with the laminated semiconductor substrate is that as the lattice mismatch between the substrate and the semiconductor layer increases, high properties cannot be obtained.

More particularly, generally, a semiconductor element is produced by using a laminated semiconductor substrate that includes a semiconductor substrate hundreds of μm thick and a semiconductor layer several μm thick formed on the substrate. When the lattice mismatch between the substrate and the semiconductor layer increases in this laminated semiconductor substrate, the number of cracks occurring in the semiconductor layer is liable to increase. This is because as the number of the lattice mismatch increases, the critical thickness of the semiconductor layer for the substrate based upon the equilibrium theories decreases whereas when the semiconductor layer is formed so as to have a thickness of more than the critical thickness, cracks are liable to occur. Therefore, in the semiconductor element, the lattice mismatch between the substrate and the semiconductor layer should be reduced as much as possible.

The substrates generally used in the semiconductor elements are limited to substrates made of Si, GaAs, InP, GaP and InAs, respectively, and all substrates having their respective proper lattice constants cannot be used. Therefore, when the formation of a semiconductor layer having a specified function on a substrate is tried, there occurs a lattice mismatch between the semiconductor layer and the substrate in many cases. In order to reduce the number of cracks occurring in the semiconductor layer even when there is such a lattice mismatch, a method of growing a buffer layer having a lattice constant between those of the substrate and the semiconductor layer has been tried. This method is disclosed, for example, in Published Japanese Patent Application Hei 7-94524. In this method, when the lattice mismatch between the substrate and the semiconductor layer is small the buffer layer absorbs a considerable number of cracks in the semiconductor layer to thereby reduce the number of cracks therein.

In this method, however, when the lattice mismatch between the substrate and the semiconductor layer increases, the buffer layer itself would be subjected to distortion to thereby store distortion energy for elastic deformation in the entire buffer layer. When the distortion energy becomes larger than the crack energy, it is difficult to prevent the occurrence of cracks. Therefore, when the lattice mismatch between the substrate and the semiconductor layer increases in the conventional buffer layer, it is difficult to alleviate the influence of the lattice mismatch. More specifically, when the lattice mismatch is not less than 1%, it is difficult to alleviate the influence of the lattice mismatch and the number of cracks in the semiconductor layer cannot be reduced sufficiently.

As described above, the problem with the laminated semiconductor substrate is that when the lattice mismatch between the substrate and the semiconductor layer increases, a high property cannot be obtained. This is because it is difficult to increase the thickness of the semiconductor layer beyond its critical thickness for the substrate based upon the equilibrium theories and reduce the number of cracks occurring thereon.

SUMMARY OF THE INVENTION

The present invention is based upon the recognition of such problems. It is an object of the present invention to provide at low cost an optical semiconductor element using a GaAs substrate for a long wavelength and having high properties. It is another object of the present invention to provide a laminated semiconductor substrate including a substrate and a semiconductor layer laminated on the substrate, wherein the semiconductor layer has a thickness of not less than its critical thickness for the substrate based upon the equilibrium theories and the number of cracks occurring therein is reduced.

According to embodiments of the present invention, there is provided an optical semiconductor element comprising:

a substrate of GaAs having a first surface and a second surface opposite to each other;

a buffer layer of $In_jGa_{1-j}As_{1-k}N_k$ ($0 \leq j \leq 1$, $0.002 \leq k \leq 0.05$) formed on said first surface of said substrate;

a first conductive type clad layer formed on said buffer layer;

an active layer formed on said first conductive type clad layer and comprising a well layer of $In_zGa_{1-z}As$ ($0 \leq z \leq 1$), said well layer having a smaller bandgap than said first conductive type clad layer, said active layer having a thickness of more than its critical thickness for said substrate based upon equilibrium theories; and a second conductive type clad layer formed on said active layer and having a larger bandgap than said well layer.

According to embodiments of the present invention, there is further provided a laminated semiconductor substrate comprising:

a semiconductor substrate;

a semiconductor layer formed over said semiconductor substrate and having a larger thickness than its critical thickness for said semiconductor substrate based on equilibrium theories; and a buffer layer formed between said semiconductor substrate and said semiconductor layer, said buffer layer being made of $In_jGa_{1-j}As_{1-k}N_k$ ($0 \leq j \leq 1$, $0.002 \leq k \leq 0.05$).

DETAILED DESCRIPTION OF THE INVENTION

Before going into a detailed description of embodiments according to the present invention, a result of unique experiments performed by the inventors and considered as a premise of the invention will be described next.

One of the features of the present invention lies in that a buffer layer is provided between the substrate and the semiconductor layer, and the buffer layer is made of $In_jGa_{1-j}As_{1-k}N_k$ ($0 \leq j \leq 1$, $0.002 \leq k \leq 0.05$). Thus, a semiconductor layer can be formed over the substrate of Si, GaAs, InP, GaP or InAs such that the lattice mismatch between the semiconductor layer and the substrate is not less than 1%, that the semiconductor layer has a larger thickness than its critical thickness for the substrate based upon the equilibrium theories and that the crack density in the semiconductor layer is reduced. Now, the embodiments of the present invention will be described next with reference to FIG. 1.

Figure 1:
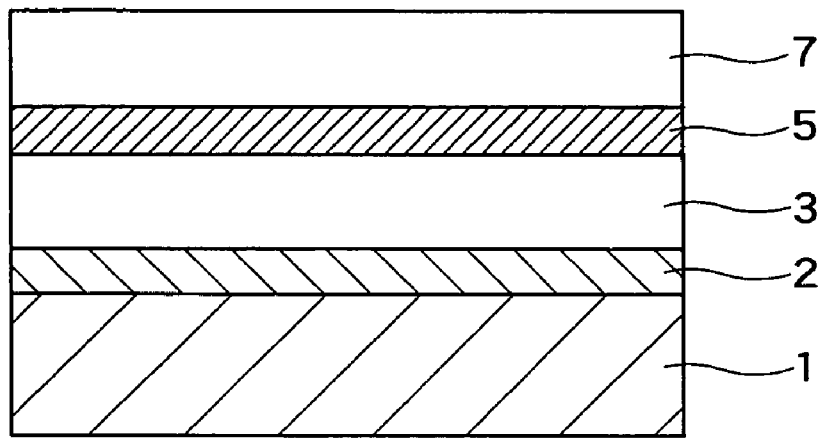
FIG. 1 is a schismatic cross-sectional view of a laminated semiconductor substrate according to the embodiment of the invention.

FIG. 1 is a schematic cross-sectional view of a laminated semiconductor substrate that the inventors use in their experiments. A first conductive-type clad layer 3 of $In_y(Ga_{1-x}Al_x)_{1-y}As$ ($0 \leq x \leq 1$, $0 \leq y \leq 0.1$), an active layer (well layer) 5 of $In_zGa_{1-z}As$ ($z=0.4$), and a second conductive-type clad layer 7 of $In_y(Ga_{1-x}Al_x)_{1-y}As$ ($0 \leq x \leq 1$, $0 \leq y \leq 0.1$) are sequentially formed over a 300 µm-thick GaAs substrate 1 via a buffer layer 2. The lattice constant of $In_{0.4}Ga_{0.6}As$ composing the active layer 5 is approximately 0.580 nm, and the lattice constant of GaAs composing the substrate 1 is approximately 0.565 nm. So the lattice mismatch between the substrate 1 and the active layer is 2.7%.

The inventors examine the relationship between the thickness of the active layer 5, the material and thickness of the buffer layer 2 and the density of cracks in the active layer 5 in the laminated semiconductor substrate of FIG. 1. Two different values of the thickness of the active layer 5, 2 nm and 8 nm are used, the thickness of 2 nm is smaller than the critical thickness of active layer for substrate 1 based upon the equilibrium theories, and the thickness of 8 nm is larger than the critical thickness. As a result, it is found that when the buffer layer 2 is made of $In_jGa_{1-j}As_{1-k}N_k$ ($0 \leq j \leq 1$, $0.002 \leq k \leq 0.05$) and has a thickness from 2 nm to 40 nm, the cracks density in the active layer 5 is reduced even if the thickness of the active layer 5 is 8 nm.

Specifically, first, when the active layer 5 has a thickness of 2 nm, the half-width of the second conductive-type clad layer 7 is 20 seconds according to X-ray diffraction measurement. That is, the crack density in the active layer 5 and the second conductive-type clad layer 7 is small.

Next, when the active layer 5 has a thickness of 8 nm and the nitrogen composition k of the $In_jGa_{1-j}As_{1-k}N_k$ buffer layer 2 is 0, the half-width of the second conductive-type clad layer 7 reaches 200 seconds according to the X-ray diffraction measurement. That is, a large number of cracks occurred in the active layer 5 and the second conductive-type clad layer 7. As just described above, when the thickness of the active layer 5 increases beyond its critical thickness for the substrate 1 based upon the equilibrium theories, a large number of cracks normally occurs in the active layer 5 and the second conductive-type clad layer 7 formed on the active layer 5.

Then, when the active layer 5 has a thickness of 8 nm, the nitrogen composition k of the $In_jGa_{1-j}As_{1-k}N_k$ buffer layer 2 is in the range from 0.002 to 0.05 (equal to or more than 0.002 and equal to or less than 0.05), and the buffer layer 2 has a thickness in the range from 2 nm to 40 nm, the half-width of the second conductive-type clad layer 7 is 40 seconds according to the X-ray diffraction measurement. That is, even when the active layer 5 has a thickness of more than its critical thickness for the substrate 1 based upon the equilibrium theories, the crack density in the active layer 5 and the second conductive-type clad layer 7 is reduced.

As described above, it is found that the crack density in the active layer 5 is reduced by forming the buffer layer 2 made of $In_jGa_{1-j}As_{1-k}N_k$ ($0 \leq j \leq 1$, $0.002 \leq k \leq 0.05$). The inventors consider that the reason for this derives from the characteristic of the InGaAsN crystals composing the buffer layer 2. Usually, when the buffer layer 2 has a thickness of more than its critical thickness for the substrate 1 based upon the equilibrium theories, cracks will occur in the buffer layer 2. Even when the buffer layer 2 is made of InGaAsN, micro cracks will occur in the buffer layer 2. However, when the buffer layer 2 is made of InGaAsN and the lattice mismatch between the buffer layer 2 and the substrate 1 is limited to within 2.9%, macro cracks are difficult to occur although micro cracks would occur. The reason for this is analyzed as follows: because when the InGaAsN crystals grow over the GaAs substrate 1, the atoms of the InGaAs crystals are apt to be positioned at positions coinciding with the positions of the atoms of the GaAs substrate 1 in the heterointerface even if the buffer layer has a thickness of more than its critical thickness. In other words, it is analyzed that the InGaAsN layer is elastically deformable if $e^2d \leq 34$ [$\%^2$ nm] where e [%] is the lattice mismatch between the InGaAsN layer and the substrate 1, and d [nm] is the thickness of the InGaAsN layer 2. In more detail, it is analyzed that even when dangling bonds are produced from nitrogen atoms in the InGaAsN crystals, an increase in the energy due to the production of the dangling bonds is small, because the electronegativity of the nitrogen atoms is high, and because the difference in radius between nitrogen and arsenic atoms in the crystal is high. As just described, InGaAsN has the property that macro cracks are difficult to occur although micro cracks would occur. As a result, it is considered that a high quality active layer 5 will be formed over the buffer layer 2 if the buffer layer 2 is made of InGaAsN.

While in the laminated semiconductor substrate of FIG. 1, as described above, the substrate 1 is illustrated as made of GaAs, it may be made of Si, InP, InAs or GaP to produce similar advantageous effects. That is, as described above, if the lattice mismatch between the InGaAsN layer 2 and the substrate 1 is not more than 2.9%, the InGaAsN layer 2 is elastically deformable and macro cracks are difficult to occur in the InGaAsN layer 2 even when the InGaAsN layer 2 has the thickness of more than its critical one. And in diamond structure or zinc blende structure semiconductor substrates which is commercially available, GaAs, Si, InP, InAs and GaP substrate satisfy the above relationship to the $In_jGa_{1-j}As_{1-k}N_k$ ($0 \leq j \leq 1$, $0.002 \leq k \leq 0.05$) buffer layer 2. Therefore, also, when the substrate 1 is made of Si, InP, InAs or GaP, similar advantageous effects are produced.

Even when one of these substrates 1 is used, good results are obtained if the nitrogen composition k of the $In_jGa_{1-j}As_{1-k}N_k$ buffer layer 2 is in the range from 0.002 to 0.05. If the nitrogen composition k is larger than 0.05, the crystals of the buffer layer 2 would deteriorate, and the flatness of a surface of the buffer layer 2 would be impaired to thereby fail to form a high-quality active layer 5. And if the nitrogen composition k is less than 0.002, the advantageous effect of reducing the crack density in the active layer 5 would be lost.

Preferably, in the laminated semiconductor substrate of FIG. 1, the first-conductive type clad layer 3 substantially lattice matches with an upper surface of the buffer layer 2. Specifically, the lattice constant of the first-conductive type clad layer 3 is changed depending upon the In composition y. If the In composition y is 0, the lattice constant is approximately 0.565 nm. When the In composition y is 1, the lattice constant is approximately 0.606 nm. In FIG. 1, the In composition y is selected so as to be in the range from 0.05 to 0.10 to thereby cause the clad layer 3 to substantially lattice match with an upper surface of the buffer layer 2. Even when the Al composition x of the clad layer 3 is changed, its lattice constant changes only by approximately 0.1%.

While in the above description the active layer 5 has been illustrated as having a thickness of more than its critical thickness for the substrate 1 based upon the equilibrium theories, it can be considered that the semiconductor layer 3 and 5 has a thickness of more than its critical thickness based upon the equilibrium theories.

As described above, according to the inventors' experiments, it is found that by providing the $In_jGa_{1-j}As_{1-k}N_k$ ($0 \leq j \leq 1$, $0.002 \leq k \leq 0.05$) buffer layer 2 between the substrate 1 and the active layer 5, the active layer 5 is satisfactorily formed, having a thickness of more than its critical thickness for the substrate 1 based upon the equilibrium theories and reducing the crack density in the active layer 5. Now, the embodiments of semiconductor elements obtained, using the laminated semiconductor substrates according to this experiment, and specified examples of optical semiconductor elements will be described.

First Embodiment

A semiconductor element of the first embodiment is an edge emitting type optical semiconductor using a GaAs substrate for a long wavelength (in the range from 1.25 μm to 1.6 μm).

Figure 2:
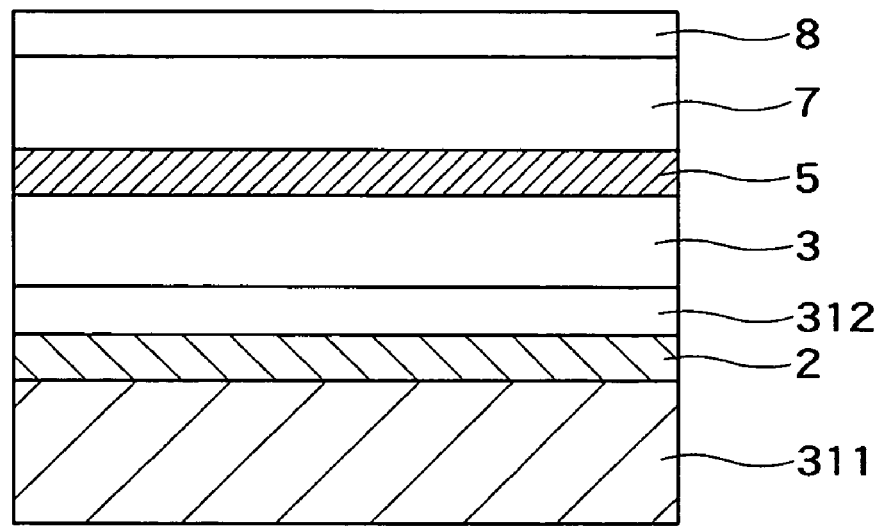
FIG. 2 is a schismatic cross-sectional view of a semiconductor element according to a first embodiment of the invention.

FIG. 2 is a schematic cross-sectional view of the optical semiconductor element of the first embodiment according to the present invention. Sequentially formed on a substrate 311 of first conductive-type GaAs are a buffer layer 2 of $In_jGa_{1-j}As_{1-k}N_k$ ($0.05 \leq j \leq 0.2$, $0.002 \leq k \leq 0.05$), a middle layer 312 of InGaAs, a first conductive-type clad layer 3 of $In_y(Ga_{1-x}Al_x)_{1-y}As$ ($0 \leq x \leq 1$, $0.05 \leq y < z$), an active layer (well layer) 5 of $In_zGa_{1-z}As$ ($z \leq 0.5$) having a thickness of 8 nm, an second conductive-type clad layer 7 of $In_y(Ga_{1-x}Al_x)_{1-y}As$, and a second conductive-type contact layer 8. The active layer 5 becomes a light emitting layer in the optical semiconductor element having the structure of FIG. 2.

Figure 3:
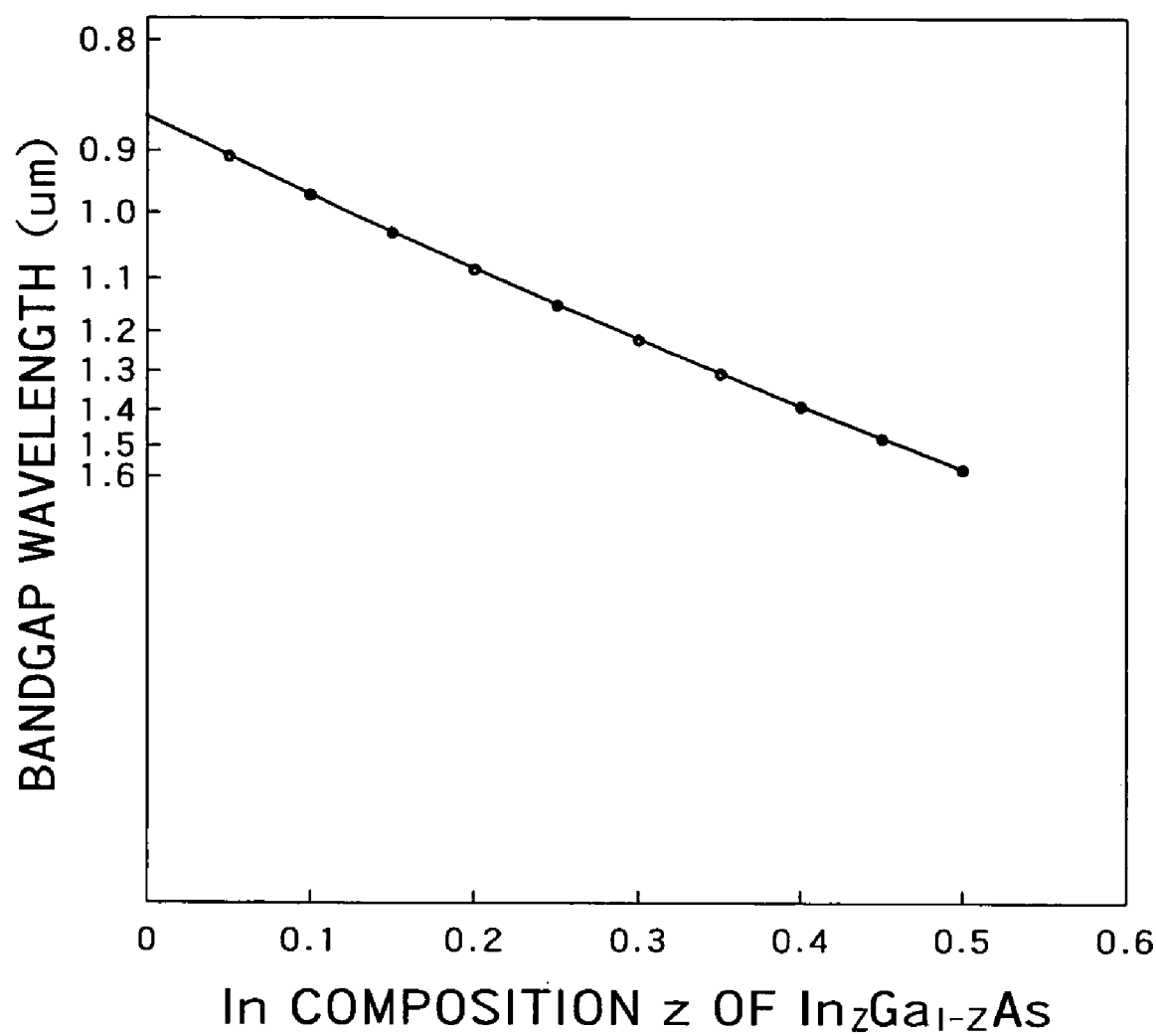
FIG. 3 shows the relationship between the In composition z of $In_zGa_{1-z}As$ and a bandgap wavelength of the $In_zGa_{1-z}As$.

FIG. 3 illustrates the relationship between the In composition z of $In_zGa_{1-z}As$ composing the active layer 5 and the bandgap wavelength of this $In_zGa_{1-z}As$. Actually the wavelength of light emitted from the $In_zGa_{1-z}As$ active layer 5 shifts toward the short wavelength side by a quantum effect based on a decrease in the thickness of the active layer 5, but this quantum effect is ignored in FIG. 3. As will be seen in FIG. 3, the In composition z of $In_zGa_{1-z}As$ needs to increase to lengthen the bandgap wavelength. For example, in order that the bandgap wavelength increases beyond 1.2 μm, the In composition z of $In_zGa_{1-z}As$ needs to be not less than approximately 0.3. Therefore, in order that the bandgap wavelength is not less than 1.3 μm, the In composition z of $In_zGa_{1-z}As$ should be not less than approximately 0.35. Considering the quantum effect as well, the In composition z of the active layer 5 should be approximately in the range from 0.35 to 0.40 and its thickness should be not less than 4 nm in order that the wavelength of light emitted from the $In_zGa_{1-z}As$ active layer 5 is approximately in the range from 1.25 μm to 1.3 μm.

Since the element of FIG. 2, as described above, by forming the $In_jGa_{1-j}As_{1-k}N_k$ buffer layer 2, the In composition j of the buffer layer 2 can be set to an appropriate value to thereby provide an light emitting element for a long wavelength and a high light emission intensity, which will be described next with reference to FIG. 4.

Figure 4:
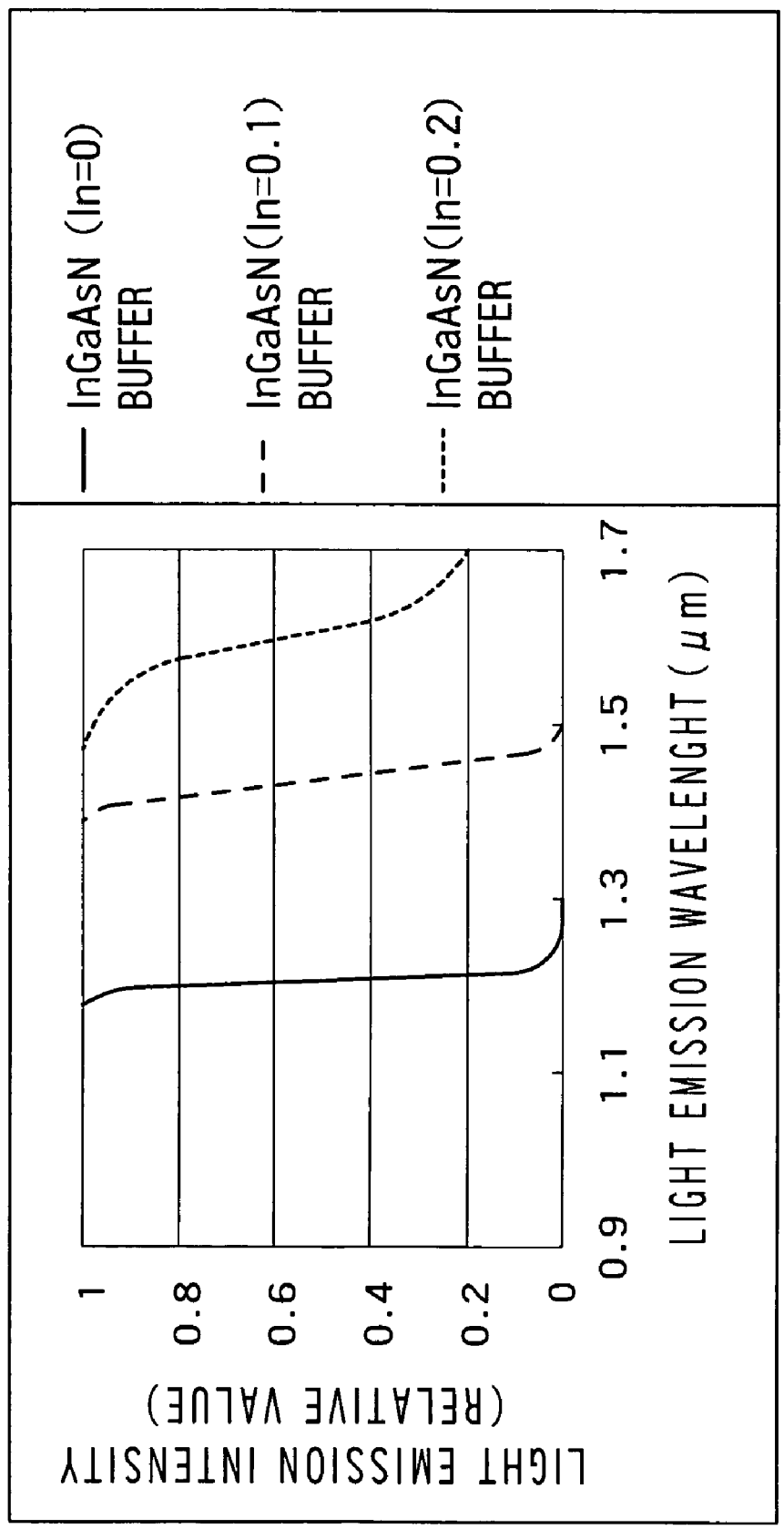
FIG. 4 shows the relationship between light emission wavelength and light emission intensity of the element of FIG. 2, depending upon the In composition j of the $In_jGa_{1-j}As_{1-k}N_k$ ($0 \leq j \leq 1$, $0.002 \leq k \leq 0.05$) buffer layer 2.

FIG. 4 illustrates the relationship between the light emission wavelength and light emission intensity of the element of FIG. 2 depending on the In composition j of the $In_jGa_{1-j}As_{1-k}N_k$ ($0 \leq j \leq 1$, $0.002 \leq k \leq 0.05$) buffer layer 2. In FIG. 4, "InGaAsN buffer layer (In=0)" substantially means that there is no $In_jGa_{1-j}As_{1-k}N_k$ buffer layer 2. In FIG. 4, three different values of the In composition j, 0, 0.1 and 0.2 are used.

As will be seen in FIG. 4, in the InGaAsN buffer layer (In=0), a high light emission intensity is obtained at a light emission wavelength of approximately 1.15 μm. However, when the light emission wavelength is in the range from 1.25 μm to 1.3 μm, the light emission intensity extremely decreases because the number of cracks occurs in the active layer 5. As described above, in order that the light emission wavelength is in the range from 1.25 μm to 1.3 μm, the In composition z of the $In_zGa_{1-z}As$ active layer 5 should be in the range from 0.35 to 0.40. When the In compositions z of the active layer 5 increases to a value in the range from 0.35 to 0.40, the lattice mismatch between the active layer 5 and the substrate 1 increases to thereby the number of cracks occurs in the active layer 5. Thus, the light emission intensity decreases. Hence, when the In composition of the InGaAsN buffer layer 2 is 0 and the light emission wavelength is approximately 1.3 μm, the light emission intensity extremely decreases.

In contrast, as will be seen in FIG. 4, when the In composition j of the $In_jGa_{1-j}As_{1-k}N_k$ buffer layer 2 is 0.1, a high light emission intensity is obtained at a light emission wavelength of approximately 1.4 μm.

This is because, by providing the $In_{0.1}Ga_{0.9}As_{1-k}N_k$ buffer layer 2, cracks are difficult to occur in the active layer 5, even when the In composition z of the $In_zGa_{1-z}As$ active layer 5 is not less than 0.40. In other words, this is because cracks are difficult to occur in the active layer 5, even when the thickness of the active layer 5 is in the range from 4 nm to 8 nm.

As will be seen in FIG. 4, when the In composition j of the $In_jGa_{1-j}As_{1-k}N_k$ buffer layer 2 is 0.2, a high light emission intensity is obtained up to a light emission wavelength of approximately 1.6 μm.

In the case of j=0.5, a curve positioning at substantially a middle position between j=0 and j=0.1 is obtained. In this case, a high light emission intensity is obtained at a light emission wavelength in the range from approximately 1.25 μm to 1.3 μm.

As described above, in the optical semiconductor element of FIG. 2, when the In composition j of the $In_jGa_{1-j}As_{1-k}N_k$ buffer layer 2 is not less than 0.05, an element having a light emission wavelength of not less than 1.25 μm and a high light emission intensity is obtained.

In the optical semiconductor element of FIG. 2, as described above, the In composition y of the $In_y(Ga_{1-x}Al_x)_{1-y}As$ ($0 \leq x \leq 1$, $0.05 \leq y \leq z$) clad layers 3 and 7 are selected such that the lattice mismatch between the active layer 5 and each of the clad layers 3 and 7 is not excessively large, and the crystals of the active layer 5 are difficult to deteriorate. More specifically, when the In composition z of the $In_zGa_{1-z}As$ active layer 5 is not less than 0.35, the In compositions y of the clad layers 3 and 7 should be not less than 0.05. The In compositions y of the clad layers 3 and 7 should be selected so as to be lower than the In composition z of the $In_zGa_{1-z}As$ active layer 5. Thus, the degrees of light absorption of the clad layers 3 and 7 are reduced and comfortable compressive distortion may be applied to the active layer 5, to improve the characteristic of the element. And thus, improve the response characteristic of a light absorption device using excitons.

Still in the optical semiconductor element in FIG. 2, the active layer 5 has the thickness of 8 nm. However, it may be changed to a value equal to or thicker than 4 nm and equal to or thinner than 20 nm, or preferably, to a value equal to or thicker than 6 nm and equal to or thinner than 8 nm. If the active layer 5 is excessively thinned, the quantum effect will become excessively intensive, and the wavelength of the light from the active layer 5 will be shortened. Therefore, thickness of the active layer 5 is preferably controlled to be equal to or thicker than 4 nm. If thickness of the active layer 5 reaches or exceeds the critical thickness for the clad layer 3 based upon equilibrium theories, then the active layer 5 will suffer cracks, and its emission efficiency will degrade. Therefore, thickness of the active layer 5 is preferably controlled not to exceed 20 nm. When thickness of the active layer 4 is adjusted in the range from 6 nm to 8 nm, it is possible to enhance confinement of light and thereby enhance the emission efficiency still more.

Preferably, the lattice mismatch between the buffer layer 2 and the GaAs substrate 311 of the optical semiconductor element of FIG. 2 is within 2.9%.

In the optical semiconductor element of FIG. 2, the surface of the buffer layer 2, the middle layer 312 and the clad layers 3, 7 are preferably substantially lattice matched, which means that their quantities of distortion and thicknesses are within a limit of elastic deformation.

Second Embodiment

A semiconductor element of a second embodiment is a surface emitting type optical semiconductor element. The semiconductor element of the second embodiment is mainly different from the first embodiment (FIG. 1) in that, as shown in FIG. 5, each of the clad layers 42 and 44 has a DBR structure in which two kinds of semiconductor layers are alternately laminated.

Figure 5:
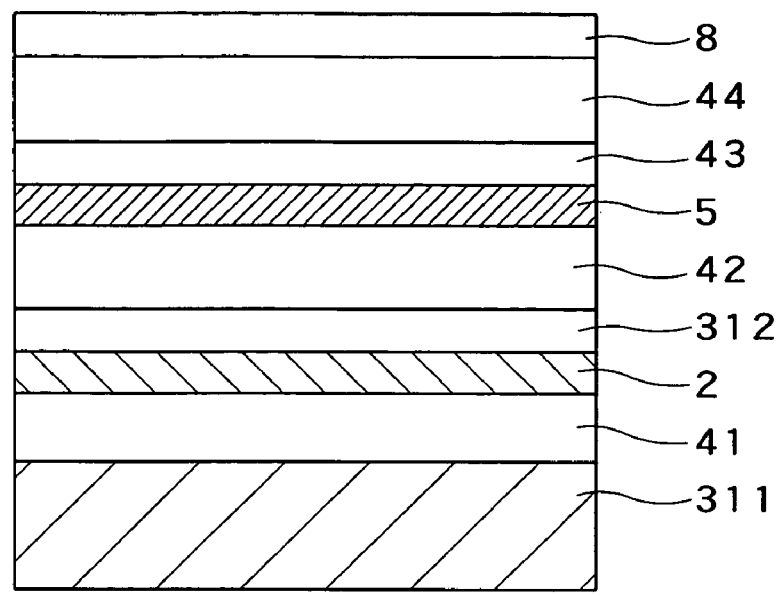
FIG. 5 is a schematic cross-sectional view of a semiconductor element according to a second embodiment of the invention.

FIG. 5 is a schematic cross-sectional view of an optical semiconductor element of the second embodiment. Sequentially formed on a first conductive-type GaAs substrate 311 are a GaAs buffer layer 41, an $In_jGa_{1-j}As_{1-k}N_k$ ($0 \leq j \leq 1$, $0.002 \leq k \leq 0.05$) buffer layer 2, an InGaAs middle layer 312, a first conductive type clad layer 42 having a DBR structure of alternate layers of $In_t(Ga_{1-s}Al_s)_{1-t}As$ ($0 \leq s \leq 1$, $0 \leq t \leq 1$) and $In_v(Ga_{1-u}Au_u)_{1-v}As$ ($0 \leq u \leq 1$, $0 \leq v \leq 1$), an $In_zGa_{1-z}As$ active layer (well layer) 5, an InGaAs layer 43 substantially lattice matching with the middle layer 312, a second conductive type clad layer 44 having a DBR structure of alternate layers $In_t(Ga_{1-s}Al_s)_{1-t}As$ and $In_v(Ga_{1-u}Al_u)_{1-x}As$, and an InGaAs contact layer 8.

In the element of FIG. 5, the clad layers 42 and 44 have the DBR structure and reflect light having a wavelength of λ from the active layer 5. Therefore, the light from the active layer 5 is amplified by the clad layers 42 and 44 formed respectively above and below the active layer 5. The amplified light is then taken out from the upper surface in FIG. 5. That is, the element of FIG. 5 is a surface emitting element.

The surface emitting element of FIG. 5 can emit light having a wavelength of not less than 1.25 μm and have a high emitting intensity, by setting the In composition j of the $In_jGa_{1-j}As_{1-k}N_k$ buffer layer 2 not less than 0.05.

In the element of FIG. 5, the GaAs substrate 311 and the GaAs buffer layer 41 may be together understood as a GaAs substrate. The middle layer 312 and the first conductive-type clad layer 42 may be together understood as a first conductive-type clad layer. In this, "clad layer" points to a layer having a larger bandgap than the well layer.

Third Embodiment

Figure 6:
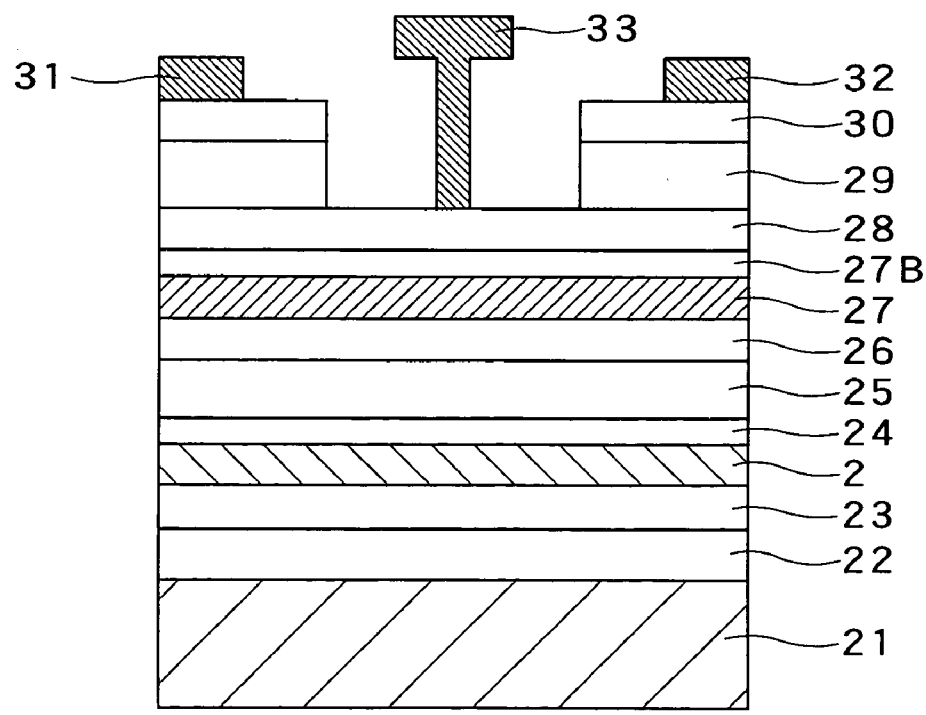
FIG. 6 is a schematic cross-sectional view of a semiconductor element according to a third embodiment of the invention.

A semiconductor element of a third embodiment according to the present invention is a transistor using a Si substrate. FIG. 6 is a schematic cross-sectional view of a transistor of the third embodiment. Formed on a Si substrate 21 are a GaAs low-temperature-grown buffer layer 22, a high-temperature-grown GaAs layer 23, an $In_jGa_{1-j}As_{1-k}N_k$ ($0 \leq j \leq 1$, $0.002 \leq k \leq 0.05$) buffer layer 2, a high-quality GaAs layer 24, a GaAlAs back-gate layer 25, a GaAs spacer layer 26, an InGaAs active layer 27, a GaAs spacer layer 27B, a GaAlAs gate layer 28, a GaAs conductive layer 29, an InGaAs contact layer 30, a source electrode 31, a drain electrode 32 and a gate electrode 33.

Since the $In_jGa_{1-j}As_{1-k}N_k$ buffer layer 2 is used in the transistor of FIG. 6, cracks are fixed in the buffer layer 2 to thereby reduce a crack density through the semiconductor layers 25 to 28. Thus, the thickness of the high-quality GaAs layer 24 is reduced, its manufacturing time is reduced and its productivity is improved. Thus, the cost is reduced.

In contrast, in the prior art, when a Group III-V compound semiconductor is formed on a Si substrate, the thickness of the high-quality GaAs layer 24 must be thick to reduce the number of cracks occurring in the semiconductor layers 25 to 28. Therefore, the productivity is low and the cost is high.

EXAMPLES

Next, specified examples of the present invention will be explained.

First Example

An optical semiconductor element of first example is a edge emitting type semiconductor laser diode using a GaAs substrate that emits light with a wavelength of 1.26 μm.

Figure 7:
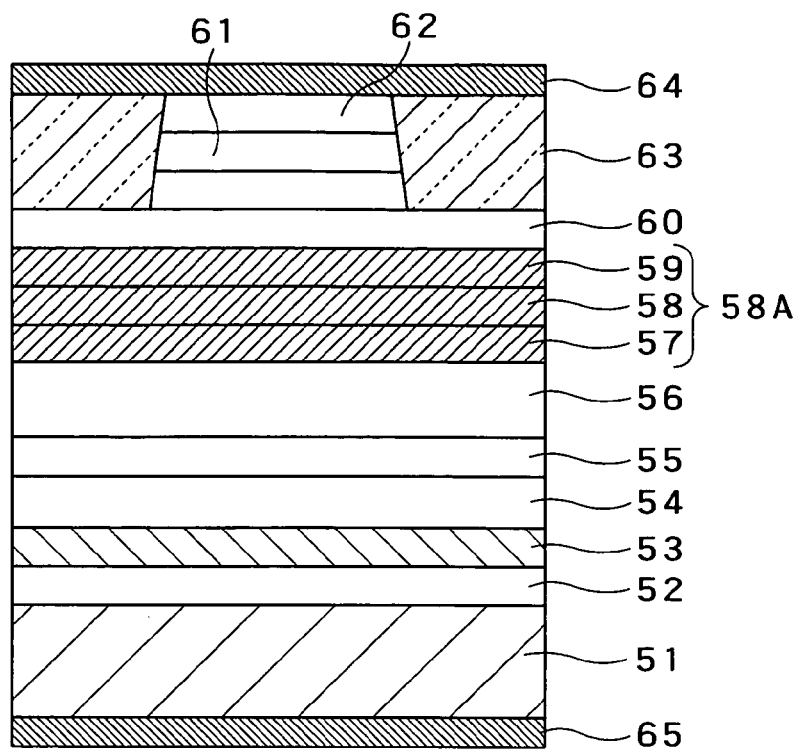
FIG. 7 is a schematic cross-sectional view of an optical semiconductor element according to a first example of the invention.

FIG. 7 is a schematic cross-sectional view of the semiconductor laser diode according to the first example of the invention. Sequentially formed on an n-type GaAs substrate 51 in MOCVD method are a GaAs buffer layer 52, a buffer layer 53 of $In_{0.10}Ga_{0.90}As_{0.99}N_{0.01}$, a first middle layer 54 of $In_{0.07}Ga_{0.93}As$, a second middle layer 55 of $In_{0.07}Ga_{0.73}Al_{0.20}As$, an n-type clad layer 56 of $In_{0.07}Ga_{0.43}Al_{0.50}As$, an active layer 58A. The active layer 58A has a structure in which an n-side light guide layer 57 of $In_{0.15}Ga_{0.70}Al_{0.15}As$, a well layer 58 of $In_{0.35}Ga_{0.65}As$, and a p-side light guide layer 59 of $In_{0.15}Ga_{0.70}Al_{0.15}As$ are formed sequentially. Sequentially formed on the active layer 58A are a p-type clad layer 60 of $In_{0.07}Ga_{0.43}Al_{0.50}As$, a barrier alleviation layer 61 of $In_{0.07}Ga_{0.93-g}Al_gAs$ ($0 \leq g \leq 0.5$; g decreases upwards in the Figure), and a contact layer 62 of $In_{0.07}Ga_{0.93}As$. The p-type clad layer 60, barrier alleviation layer 61 and contact layer 62 are processed so as to form a mesa, each side of which is filled with $In_{0.07}Ga_{0.23}Al_{0.70}As$, as shown in FIG. 7. A p-side electrode 64 is formed on the contact layer 62 so as to connect electrically to the contact layer 62. In other words, the p-side electrode 64 is formed over the p-type clad layer 60 so as to connect electrically to the p-type clad layer 60. An n-side electrode 65 as another electrode is formed on the back surface of the substrate 51. In the semiconductor laser diode of FIG. 7, the layers 54 through 56 can be together understood as an n-type clad layer and the layers 60 through 61 can be together understood as a p-type clad layer.

In the semiconductor laser diode of FIG. 7, light having a wavelength of 1.26 μm is emitted from the well layer 58 of the active layer 58A by current injection from the p-side and n-side electrodes 64 and 65. This light is then amplified to become a laser beam, which is then emitted in the direction perpendicular to the plane of FIG. 7.

In the semiconductor laser diode of FIG. 7, as described above, the buffer layer 53 of $In_{0.1}Ga_{0.90}As_{0.99}N_{0.01}$ is provided. Thus, the threshold current density is reduced to 200 mA/cm² when the oscillation wavelength is 1.26 μm. That is, a high-characteristic element that emits light of a long wavelength is provided. Without the buffer layer 53, the oscillation threshold current density would exceed 1 kA/cm².

Since the semiconductor laser diode of FIG. 7 uses the GaAs substrate 311, its cost is reduced and its temperature characteristic is improved.

In the semiconductor laser diode of FIG. 7, the In composition z of the $In_zGa_{1-z}As$ well layer 58 is 0.35 and the light emission wavelength is 1.26 μm (FIG. 3). The In composition j of $In_jGa_{1-j}As_{1-k}N_k$ buffer layer 52 is selected so as to be approximately 0.1 to increase the light emission intensity (FIG. 4). In this semiconductor laser diode, the In composition z of the $In_zGa_{1-z}As$ well layer 58 can increase up to 0.5 and the light emission wavelength up to approximately 1.6 μm (FIG. 3). In this case, a high light emission intensity is maintained by increasing the In composition j of the $In_jGa_{1-j}As_{j-k}N_k$ buffer layer 52 up to approximately 0.3 μm (FIG. 4). However, if the In composition z of the $In_zGa_{1-z}As$ well layer 58 increases beyond 0.50, the lattice mismatch between the well layer 58 and the substrate 52 becomes excessively large. Therefore, even if the buffer layer 52 is provided, the number of cracks occurs in the well layer 58. In this case, even if the In composition j of the $In_jGa_{1-j}As_{1-k}N_k$ buffer layer 52 increases beyond approximately 0.3, it is difficult to maintain the high light emission intensity. Therefore, in the semiconductor laser diode of FIG. 7 the upper limit of the In composition z of the $In_zGa_{1-z}As$ well layer 58 is approximately 0.50, the upper limit of the light emission wavelength is approximately 1.6 μm, and the upper limit of the In composition j of the $In_jGa_{1-j}As_{1-k}N_k$ buffer layer 52 is approximately 0.30.

In the semiconductor laser diode of FIG. 7, the active layer 58A has a structure in which the n-side light guide layer 57, the well layer 58, and the p-side light guide layer 59 are formed sequentially. However, it may be a SQW (Single Quantum Well) structure in which a well layer is formed. Also, it may be a MQW (Multi Quantum Well) structure in which well layers and barrier layers are formed alternately. Also, it may be a structure in which an n-side light guide layer, a MQW structure, and a p-side light guide layer are formed sequentially.

Second Example

An optical semiconductor element of second example is a surface emitting type semiconductor laser diode using a GaAs substrate having a light emission wavelength of λ=1.31 μm.

Figure 8:
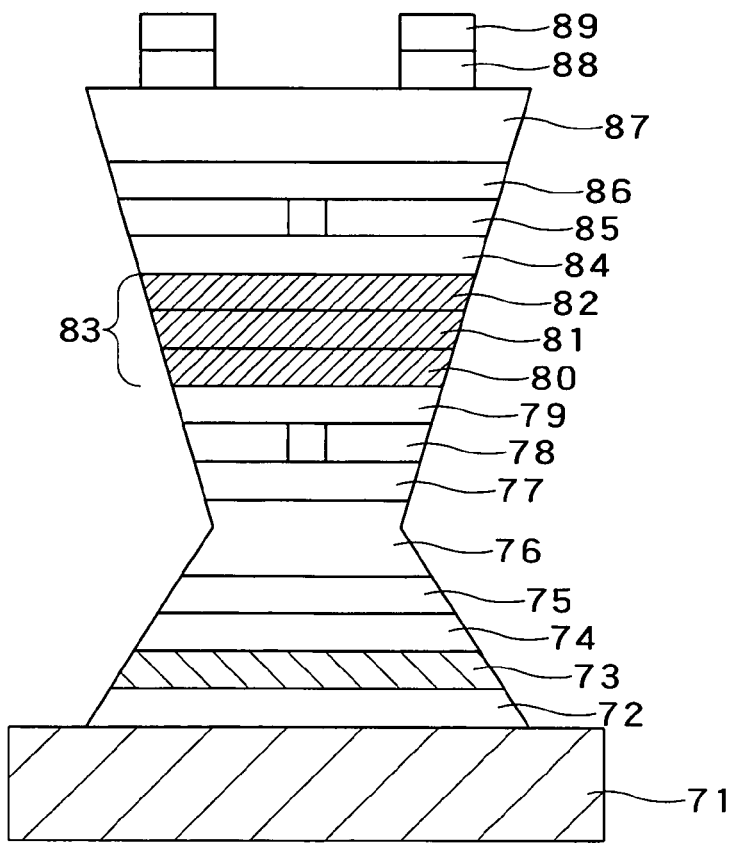
FIG. 8 is a schematic cross-sectional view of an optical semiconductor element according to a second example of the invention.

FIG. 8 is a schematic cross-sectional view of a semiconductor laser diode according to the second example of the invention. Sequentially formed on an n-type GaAs substrate 71 in MOCVD method are a GaAs buffer layer 72, a buffer layer 73 of $In_{0.13}Ga_{0.87}As_{0.99}N_{0.01}$, a first middle layer 74 of $In_{0.1}Ga_{0.9}As$, a barrier height alleviation layer 75 of $In_{0.1}Ga_{0.4}Al_{0.5}As$, an n-type clad layer 76 having a DBR structure in which $In_{0.09}Al_{0.91}As$ layers having a refractive index of $n_1$ and a thickness of $\lambda/4 n_1$, and $In_{0.1}Ga_{0.9}As$ layers having a refractive index of $n_2$ and a thickness of $\lambda/4 n_2$ are alternately formed for 24.5 pairs, an $In_{0.1}Ga_{0.9}As$ layer 77, a first $In_{0.02}Al_{0.98}As$ layer 78 having a thickness of 6 nm, an $In_{0.1}Ga_{0.9}As$ layer 79 having a thickness of 10 nm, and an active layer 83. The active layer 83 has an MQW (Multi Quantum Well) structure in which a well layer 80 of $In_{0.4}Ga_{0.6}As$ having a thickness of 8 nm, a barrier layer 81 of $In_{0.1}Ga_{0.9}As$ having a thickness of 10 nm, and a well layer 82 of $In_{0.4}Ga_{0.6}As$ having a thickness of 8 nm are formed sequentially. Sequentially formed on the active layer 83 are an $In_{0.1}Ga_{0.9}As$ layer 84 having a thickness of 5 nm, a second $In_{0.02}Ga_{0.98}As$ layer 85 having a thickness of 6 nm, an $In_{0.1}Ga_{0.9}As$ layer 86 having a thickness of 10 nm, and a p-type clad layer 87 having a DBR structure in which $In_{0.09}Al_{0.91}As$ layers having a refractive index $n_1$ and a thickness of $\lambda/4n_1$ and $In_{0.1}Ga_{0.9}As$ layers having a refractive index $n_2$ and a thickness of $\lambda/4n_2$ are alternately formed for 24.5 pairs. Sequentially formed on parts of the p-type clad layer 87 are an $In_{0.1}Ga_{0.9}As$ layer 88 and an $In_{0.1}Ga_{0.9}As$ contact layer 89. The entire element has a mesa structure. The first and second $In_{0.02}Al_{0.98}As$ layers 78 and 85 are then oxidized, excluding their respective 3 μm-diameter areas. The electrodes are not shown.

In the element of FIG. 8, the clad layers 76 and 87 have the DBR structure and reflect light having a wavelength of 1.31 μm emitted by the active layer 83. Therefore, the light from the active layer 83 is amplified by the clad layers 87 and 76 positioned respectively above and below the active layer 83. The amplified light is taken out from an upper surface of the element in FIG. 8. That is, the element of FIG. 8 is a surface emitting laser.

The surface emitting-type semiconductor laser diode of FIG. 8, as described above, comprises the buffer layer 73 of $In_{0.1}Ga_{0.9}As_{0.99}N_{0.01}$. Therefore, this diode is an element having a long oscillation wavelength of 1.31 μm and a high property. Since the semiconductor laser diode of FIG. 8 uses the GaAs substrate 311, the cost is reduced and the temperature characteristic is improved.

Third Example

An optical semiconductor element of third example is a semiconductor laser diode using a Si substrate and of a surface emitting type that emits light having a wavelength of 0.87 μm.

Figure 9:
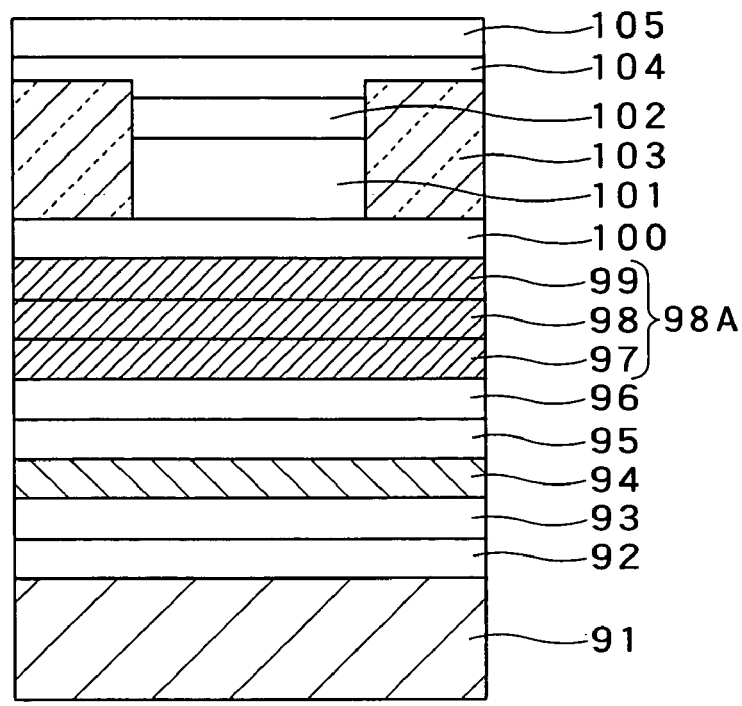
FIG. 9 is a schematic cross-sectional view of an optical semiconductor element according to a third example of the invention.

FIG. 9 is a schematic cross-sectional view of the semiconductor laser diode according to the third example of the invention. Formed on a Si substrate 91 in MOCVD method are a GaAs low-temperature buffer layer 92, a GaAs layer 93, an InGaAaN buffer layer 94, a high-quality GaAa layer 95, a GaAlAs clad layer 96, an active layer 98A. The active layer 98A has a structure in which a GaAlAs light-guide layer 97, a GaAs active layer 98, and a GaAlAs light-guide layer 99 are formed sequentially. Sequentially formed on the active layer 58A are an InGaP etching-stop layer 100, a GaAlAs clad layer 101, and a GaAs layer 102. The GaAlAs clad layer 101 and the GaAs layer 102 are etched so as to form a mesa each side of which is buried with a GaAs burying layer 103. A GaInP burying layer 104 and a GaAs contact layer 105 are sequentially formed on the burying layer 103 and the GaAs layer 102.

The semiconductor laser diode of FIG. 9 emits light having a wavelength of 0.87 μm from its active layer 98. This light is then amplified to become a laser beam, which is then radiated in the direction perpendicular to the Figure plane.

The semiconductor laser diode of FIG. 9 uses the Si substrate 91 having a smaller lattice constant (0.543 nm) than the lattice constant of the GaAs substrate (0.565 nm). The Si substrate 91 has a high thermal conductivity. Therefore, the semiconductor laser diode of FIG. 9 produces a highly linear output of up to scores of mW. That is, it provides an improved temperature characteristic.

The Si substrate 91 is further inexpensive compared to the GaAs substrate. For the Si substrates, ultra large ones exceeding a diameter of 12 inches (approximately 30 cm) have been now put to practical use. Therefore, the semiconductor laser diode of FIG. 9 is further reduced in cost compared to the semiconductor laser diode using the GaAs substrate.

Since the semiconductor laser diode of FIG. 9 uses the InGaAsN buffer layer 94, it maintains a high optical output although there is a lattice mismatch of approximately 4% between the active GaAs layer 98 and the Si substrate 91 because the InGaAsN buffer layer 94 serves to reduce the crack density in the active layer 98.

As described above, the semiconductor laser diode of FIG. 9 provides an element having an excellent temperature characteristic and produced at an extremely low cost.

Fourth Example

An optical semiconductor element of fourth Example is an absorption type optical modulation element (a photodetector element) using a GaAs substrate for a wavelength of 1.55 µm.

Figure 10:
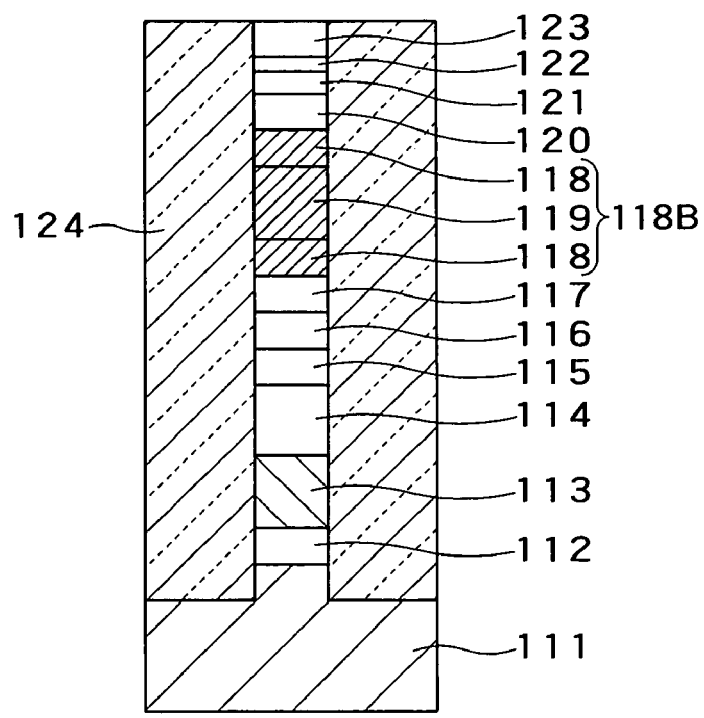
FIG. 10 is a schematic cross-sectional view of an optical semiconductor element according to a fourth example of the invention.

FIG. 10 is a schematic cross-sectional view of the absorption type optical modulation element according to the fourth example of the invention. Sequentially formed on an n-type substrate 111 of GaAs in the MOCVD method are a GaAs buffer layer 112, an $In_{0.25}Ga_{0.75}As_{0.99}N_{0.01}$ buffer layer 113, an $In_{0.24}Ga_{0.76}As$ layer 114, an $In_{0.24}Ga_{0.26}Al_{0.50}As$ layer 115, an n-type clad layer 116 of $In_{0.24}Ga_{0.06}Al_{0.70}As$, an $In_{0.28}Ga_{0.02}Al_{0.50}As$ layer 117 and an active layer 118B. The active layer 118B has a structure of a well layer 118 of $In_{0.47}Ga_{0.53}As$, a barrier layer 119 of $In_{0.28}Ga_{0.02}Al_{0.70}As$, and a well layer 118 of $In_{0.47}Ga_{0.53}As$. Sequentially formed on the active layer 118B are an $In_{0.28}Ga_{0.02}Al_{0.70}As$ layer 120, an $In_{0.24}Ga_{0.06}Al_{0.70}As$ layer 121, an $In_{0.28}Ga_{0.26}Al_{0.50}As$ layer 122 and an $In_{0.75}Ga_{0.25}As$ contact layer 123. The laminated layers 112 through 123 are etched to form a mesa, and each side of which is filled with a filling layer 124 of oxygen-contained high-resistance $In_{0.28}Al_{0.72}As$. The absorption type optical modulation element of FIG. 10 is sized such that the substrate 111 thereof has a width of 250 µm.

The absorption-type optical modulation element of FIG. 10 is operated with a reverse bias of approximately 1.5 V. In the element of FIG. 10, the lattice constant of the GaAs substrate 111 is approximately 0.565 nm whereas the lattice constant of the $In_{0.47}Ga_{0.53}As$ well layer 118 is approximately 0.587 nm. Thus, the lattice mismatch between both layers is 3.9%, the lattice mismatch is very large. However, the absorption type optical modulation element of FIG. 10 comprises the buffer layer 113 of $In_{0.25}Ga_{0.75}As_{0.99}N_{0.01}$. By comprising the buffer layer 113, although the lattice mismatch is large, the optical element has a high property including an extinction ratio of approximately 12 dB for light of 1.55 µm.

In the element of FIG. 10, because of a large quantity of distortion in active layer, the absorption coefficient per volume of the well layer 118 is large to thereby provide a voltage-extinction ratio characteristic similar to that of the optical modulator element using the InP substrate. And since the barrier layer is of an indirect transition type, a change in the refractive index is small to thereby reduce the influence of a wavelength shift compared to the modulation element using the InP substrate. And since the barrier layer 119 is of the indirect transition type, the temperature-dependency of the bandgap is small to thereby reduce the temperature-dependency of the absorption.

In the element of FIG. 10, as described above, the well layer 118 of the active layer 118B was made of $In_zGa_{1-z}As$ (z=0.47). As will be seen in FIG. 3, when the In composition z of the $In_zGa_{1-z}As$ active layer is 0.0.47, the wavelength for absorption edge increases up to approximately 1.55 µm. In this case, the lattice mismatch between the active layer 118B and the substrate 111 will increase, but high extinction ratio is maintained by increasing the In composition j of the $In_jGa_{1-j}As_{1-k}N_k$ buffer layer 113 up to 0.25.

While in the respective embodiments, as mentioned above, the InGaAsN buffer layers were illustrated as applied to the optical semiconductor elements, this may be applicable to electronic devices such as HEMT. For example, when a semiconductor electronic device is produced which uses on a GaAs substrate an InGaAs/AlGaInAs or InGaAsN/InGaAlAs Group III-V compound semiconductor layer, an InGaAsN buffer layer may be provided between the substrate and the layer that form the active areas of the electronic device. Thus, distortion applied to the active areas is reduced to thereby improve the crystal characteristic of the active layer and increase the amplification factor.

What is claimed is:

1. An optical semiconductor element comprising:
    a substrate of GaAs having a first surface and a second surface opposite to each other;
    a buffer layer of $In_jGa_{1-j}As_{1-k}N_k$ ($0 \leq j \leq 1$, $0.002 \leq k \leq 0.05$) formed on said first surface of said substrate;
    a first conductive type clad layer formed on said buffer layer;
    an active layer formed on said first conductive type clad layer and comprising a well layer of $In_zGa_{1-z}As$ ($0 \leq z \leq 1$), said well layer having a smaller bandgap than said first conductive type clad layer, said active layer having a larger thickness than its critical thickness for said semiconductor substrate based upon equilibrium theories;
    a second conductive type clad layer formed on said active layer and having a larger bandgap than said well layer; and
    a middle layer formed between said buffer layer and said first conductive type clad layer.

2. The optical semiconductor element according to claim 1, wherein said active layer emits light having a wavelength in the range from 1.25 µm to 1.6 µm by current injection.

3. The optical semiconductor element according to claim 1, wherein the In composition j of said buffer layer is in the range from 0.05 to 0.30.

4. The optical semiconductor element according to claim 3, wherein the In composition z of said well layer is in the range from 0.35 to 0.50.

5. The optical semiconductor element according to claim 1, wherein said well layer has a thickness in the range from 4 nm to 20 nm.

6. The optical semiconductor element according to claim 1, wherein a lattice mismatch between said substrate and said well layer is not less than 1%.

7. The optical semiconductor element according to claim 1, wherein lattice mismatch between said substrate and said buffer layer is not more than 2.9%.

8. The optical semiconductor element according to claim 1, wherein said buffer layer has a thickness in the range from 2 nm to 40 nm.

9. The optical semiconductor element according to claim 1, wherein said substrate is a first conductive type substrate, and further comprising:
    a first electrode formed over said second surface of said substrate so as to electrically connect to said substrate; and
    a second electrode formed over said second conductive type clad layer so as to electrically connect to said second conductive type clad layer.

10. The optical semiconductor element according to claim 1, wherein each of said first and second clad layers has a structure of alternate layers of $In_t(Ga_{1-s}Al_s)_{1-t}As$ ($0 \leq s \leq 1$, $0 \leq t \leq$) and $In_v(Ga_{1-u}Al_u)_{1-v}As$ ($0 \leq u \leq 1$, $0 \leq v \leq 1$) for reflecting light emitted by said active layer, said optical semiconductor element being of a surface emitting type.

11. A laminated semiconductor substrate comprising:
a semiconductor substrate;
a semiconductor layer formed over said semiconductor substrate and having a larger thickness than its critical thickness for said semiconductor substrate based on equilibrium theories, the semiconductor layer comprising a well layer of $In_zGa_{1-z}As$ ($0 \leq z \leq 1$);
a buffer layer formed between said semiconductor substrate and said semiconductor layer, said buffer layer being made of $In_jGa_{1-j}As_{1-k}N_k$ ($0 \leq j \leq 1$, $0.002 \leq k \leq 0.05$);
a first conductive type clad layer formed between said buffer layer and said semiconductor layer and having a larger band gap than said well layer;
a second conductive type clad layer formed on said semiconductor layer and having a larger bandgap than said well layer; and
a middle layer formed between said buffer layer and said first conductive type clad layer.

12. The laminated semiconductor substrate according to claim 11, wherein a lattice mismatch between said semiconductor layer and said semiconductor substrate is not less than 1%.

13. The laminated semiconductor substrate according to claim 11, wherein a lattice mismatch between said buffer layer and said semiconductor substrate is not more than 2.9%.

14. The laminated semiconductor substrate according to claim 11, wherein said semiconductor substrate is made of any one of GaAs, InP, InAs, GaP and Si.

15. The laminated semiconductor substrate according to claim 11, wherein said buffer layer has a thickness in the range from 2 nm to 40 nm.

* * * * *